United States Patent
Ko et al.

(10) Patent No.: US 9,202,807 B2
(45) Date of Patent: Dec. 1, 2015

(54) SEMICONDUCTOR STRUCTURE FOR ELECTROSTATIC DISCHARGE PROTECTION

(71) Applicant: Advanced Analog Technology, Inc., Hsinchu (TW)

(72) Inventors: Chun-Chung Ko, Hsinchu County (TW); Chih-Lun Wu, Changhua County (TW); Shuo-Yen Lin, Hsinchu County (TW)

(73) Assignee: Advanced Analog Technology, Inc., Science-Based Industrial Park, Hsinchu (TW)

( * ) Notice: Subject to any disclaimer, the term of this patent is extended or adjusted under 35 U.S.C. 154(b) by 0 days.

(21) Appl. No.: 14/306,253

(22) Filed: Jun. 17, 2014

(65) Prior Publication Data
US 2015/0179629 A1   Jun. 25, 2015

(30) Foreign Application Priority Data
Dec. 20, 2013 (TW) .............................. 102147566 A

(51) Int. Cl.
*H01L 27/02* (2006.01)
*H01L 23/60* (2006.01)

(52) U.S. Cl.
CPC ............ *H01L 27/0251* (2013.01); *H01L 23/60* (2013.01); *H01L 2924/0002* (2013.01)

(58) Field of Classification Search
CPC .............. H01L 29/735; H01L 29/7317; H01L 27/0251; H01L 29/861; H01L 29/7833; H01L 29/866; H01L 29/0692; H01L 29/0626; H01L 29/1087; H01L 27/0262; H01L 29/6625; H01L 27/0255; H01L 27/0259; H01L 29/6609; H01L 27/027; H01L 21/265
See application file for complete search history.

(56) References Cited

U.S. PATENT DOCUMENTS 7,626,243 B2 * 12/2009 Disney et al. ................. 257/546
2012/0119331 A1 * 5/2012 Gendron et al. .............. 257/587

* cited by examiner

*Primary Examiner* — Jessica Stultz
*Assistant Examiner* — Mohammed R Alam
(74) *Attorney, Agent, or Firm* — Winston Hsu; Scott Margo

(57) ABSTRACT

A semiconductor structure includes a P well formed on a P type substrate; a first N type electrode area formed on a central region of the P well; a first insulating area formed on the P well and surrounding the first N type electrode area; a second N type electrode area formed on the P well and surrounding the first insulating area; a second insulating area formed on the P well and surrounding the second N type electrode area; and a P type electrode area formed on the P well and surrounding the second insulating area; wherein periphery outlines of the first N type electrode area and the second N type electrode area are both 8K sided polygons or circles, and K is a positive integer.

11 Claims, 8 Drawing Sheets

SEMICONDUCTOR STRUCTURE FOR ELECTROSTATIC DISCHARGE PROTECTION

BACKGROUND OF THE INVENTION

1. Field of the Invention

The present invention relates to a semiconductor structure for electrostatic discharge protection, and more particularly, to a semiconductor structure for electrostatic discharge protection capable of improving current discharge capability.

2. Description of the Prior Art

Electrostatic discharge protection has been an important topic in the electronics industry and the semiconductor industry. Electrostatic discharge usually causes damages to electronic products. With the progress of semiconductor manufacturing process, size of an integrated circuit and an element thereof is getting smaller, and relatively, the integrated circuit is more easily damaged by electrostatic discharge. In order to prevent the integrated circuit from being damaged by the electrostatic discharge, when an electrostatic protection circuit receives static electricity, the electrostatic protection circuit must be able to allow large current to pass through, for conducting the static electricity to a ground terminal immediately. Therefore, current discharge capability of the electrostatic protection circuit is very important. The better the current discharge capability of the electrostatic protection circuit is, the better the electrostatic protection capability of the electrostatic protection circuit will be. The electrostatic protection circuit of the prior has poor current discharge capability due to improper design of an electrode, so as to affect the electrostatic discharge protection capability of the electrostatic protection circuit.

SUMMARY OF THE INVENTION

The present invention provides a semiconductor structure for electrostatic discharge protection. The semiconductor structure comprises a P well formed on a P type substrate; a first N type electrode area formed on a central region of the P well; a first insulating area formed on the P well and surrounding the first N type electrode area; a second N type electrode area formed on the P well and surrounding the first insulating area; a second insulating area formed on the P well and surrounding the second N type electrode area; and a P type electrode area formed on the P well and surrounding the second insulating area; wherein periphery outlines of the first N type electrode area and the second N type electrode area are 8K sided polygons or circles, and K is a positive integer.

In contrast to the prior art, the second N type electrode area of the semiconductor structure for electrostatic discharge protection of the present invention has a smaller non-conductive area or even has no non-conductive area, so as to improve current discharge capability between electrode areas, and further improve electrostatic protection capability of the semiconductor structure.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
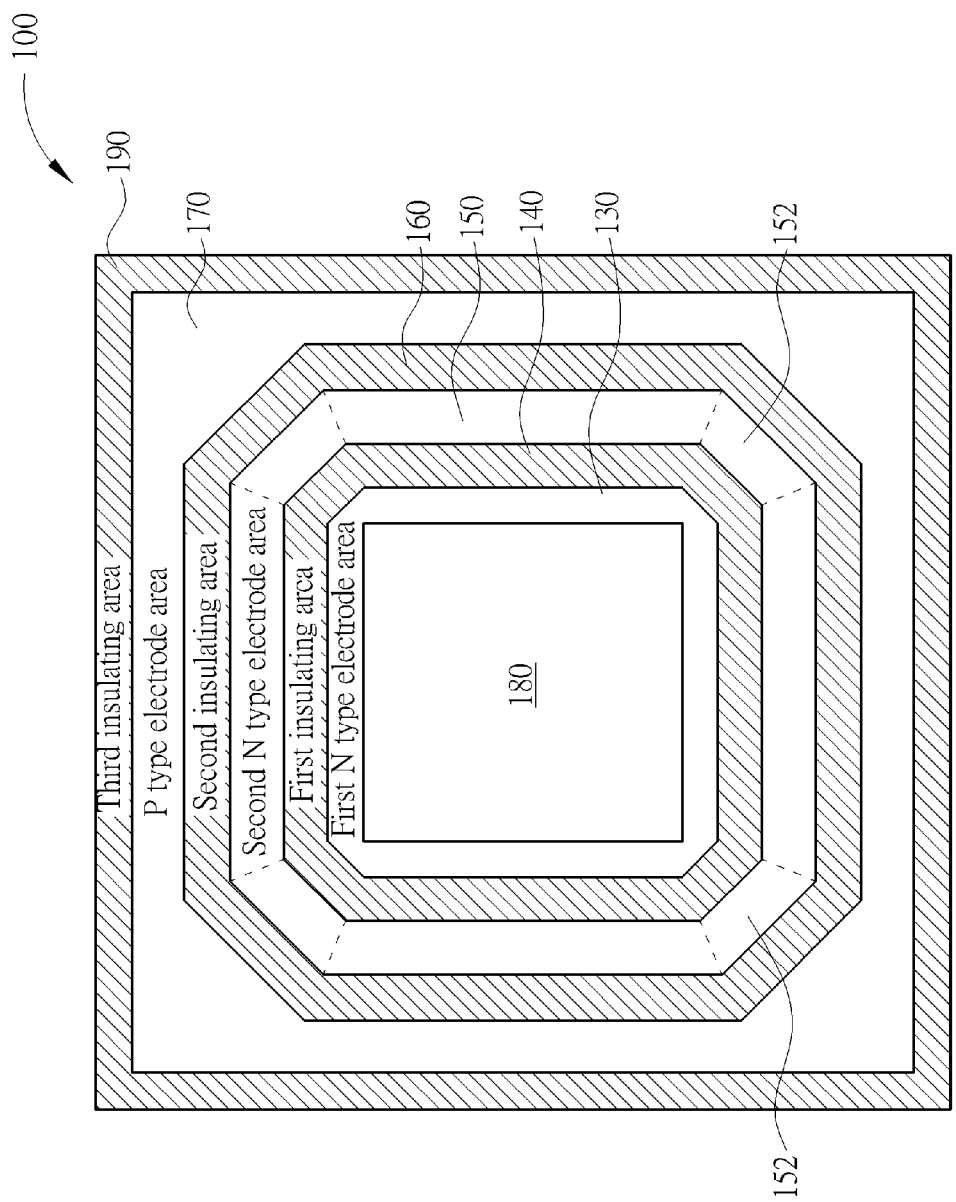
FIG. 1 is a diagram showing a first embodiment of a semiconductor structure for electrostatic discharge protection of the present invention.
Figure 2:
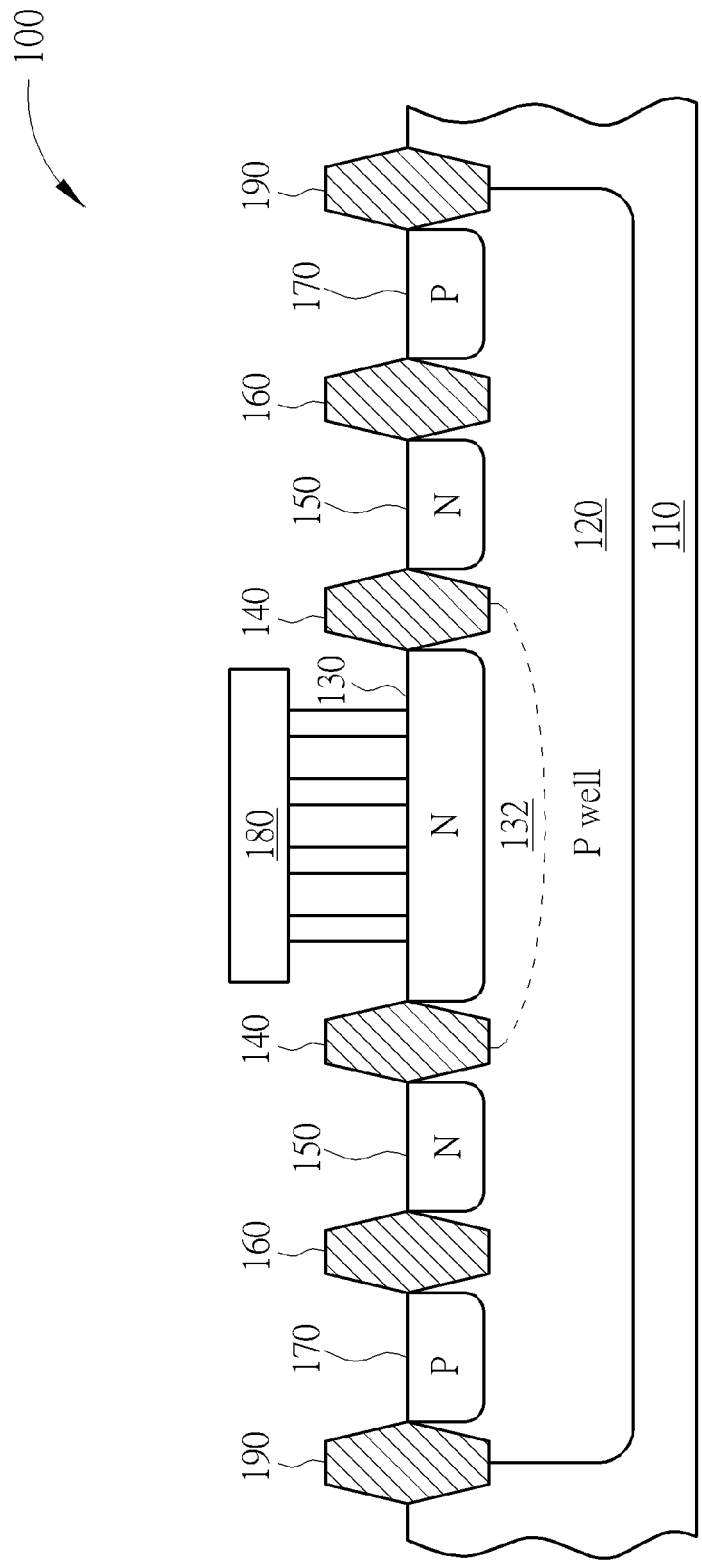
FIG. 2 is a diagram showing a cross-sectional view of the semiconductor structure for electrostatic discharge protection in FIG. 1.

Please refer to FIG. 1 and FIG. 2 together. FIG. 1 is a diagram showing a first embodiment of a semiconductor structure for electrostatic discharge protection of the present invention. FIG. 2 is a diagram showing a cross-sectional view of the semiconductor structure for electrostatic discharge protection in FIG. 1. As shown in figures, the semiconductor structure 100 for electrostatic discharge protection of the present invention comprises a P well 120, a first N type electrode area 130, a first insulating area 140, a second N type electrode area 150, a second insulating area 160, and a P type electrode area 170. The P well 120 is formed on a P type substrate 110. The first N type electrode area 130 is formed on a central region of the P well 120. The first insulating area 140 is formed on the P well 120, and surrounds the first N type electrode area 130. The second N type electrode area 150 is formed on the P well 120, and surrounds the first insulating area 140. The second insulating area 160 is formed on the P well 120, and surrounds the second N type electrode area 150. The P type electrode area 170 is formed on the P well 120, and surrounds the second insulating area 160. Wherein, periphery outlines of the first N type electrode area 130 and the second N type electrode area 150 are 8 sided polygons and concentric. The semiconductor structure 100 for electrostatic discharge protection of the present invention can further comprise an N well, such that the first N type electrode area 130 is partially formed on the N well.

In addition, the first insulating area 140 is a field oxide (FOX) area for insulating the first N type electrode area 130 from the second N type electrode area 150. The second insulating area 160 is also a field oxide area for insulating the second N type electrode area 150 from the P type electrode area 170. The first N type electrode area 130 is electrically connected to an electrostatic discharge protection electrode 180, and the P type electrode area 170 is electrically connected to ground.

According to the above arrangement, the P well 120, the first N type electrode area 130, the second N type electrode area 150, and the P type electrode area 170 can be equivalent to a bipolar junction transistor. When the electrostatic discharge protection electrode 180 receives static electricity, a PN junction between the P well 120 and the first N type electrode area 130 is broken down due to a high level voltage of the static electricity, so as to discharge current to the second N type electrode area 150 and the P type electrode area 170, in order to provide electrostatic discharge protection. Moreover, partial energy of the static electricity is absorbed when the PN junction is broken down.

In order to further improve ability resistant to high voltage, the first N type electrode area 130 can be extended outward to form an N type doping area 132. Doping concentration of the N type doping area 132 is lower than doping concentration of the first N type electrode area 130.

On the other hand, corners of the second N type electrode area 150 are non-conductive in order to prevent the second N type electrode area 150 from being damaged due to point discharge from the first N type electrode area 130. Periphery outlines of the first N type electrode area and the second N type electrode area of the prior art are squares (or quadrilaterals). In the prior art, in order to prevent the second N type electrode area from being damaged due to point discharge from four corners of the first N type electrode area, non-conductive areas of four corners of the second N type electrode area of the prior art are very large, such that current discharge capability from the first N type electrode area to the second N type electrode area is limited. In the present embodiment, the corner of the second N type electrode area 150 (that is, the shortest side) corresponds to the corner of the first N type electrode area 130, and an area corresponding to the shortest side of the second N type electrode area 150 corresponds is a non-conductive area 152, such that a range of the non-conductive area 152 of the second N type electrode area 150 is decreased, and the current discharge capability from the first N type electrode area 130 to the second N type electrode area 150 is increased.

In addition, the periphery outlines of the first N type electrode area and the second N type electrode area are not limited to 8 sided polygons. The periphery outlines of the first N type electrode area and the second N type electrode area can be 8K sided polygons, and K is a positive integer. Moreover, the semiconductor structure for electrostatic discharge protection of the present invention can further comprise a third insulating area 190, which is formed on a periphery of the P well 120, and surrounds the P type electrode area 170.

Figure 3:
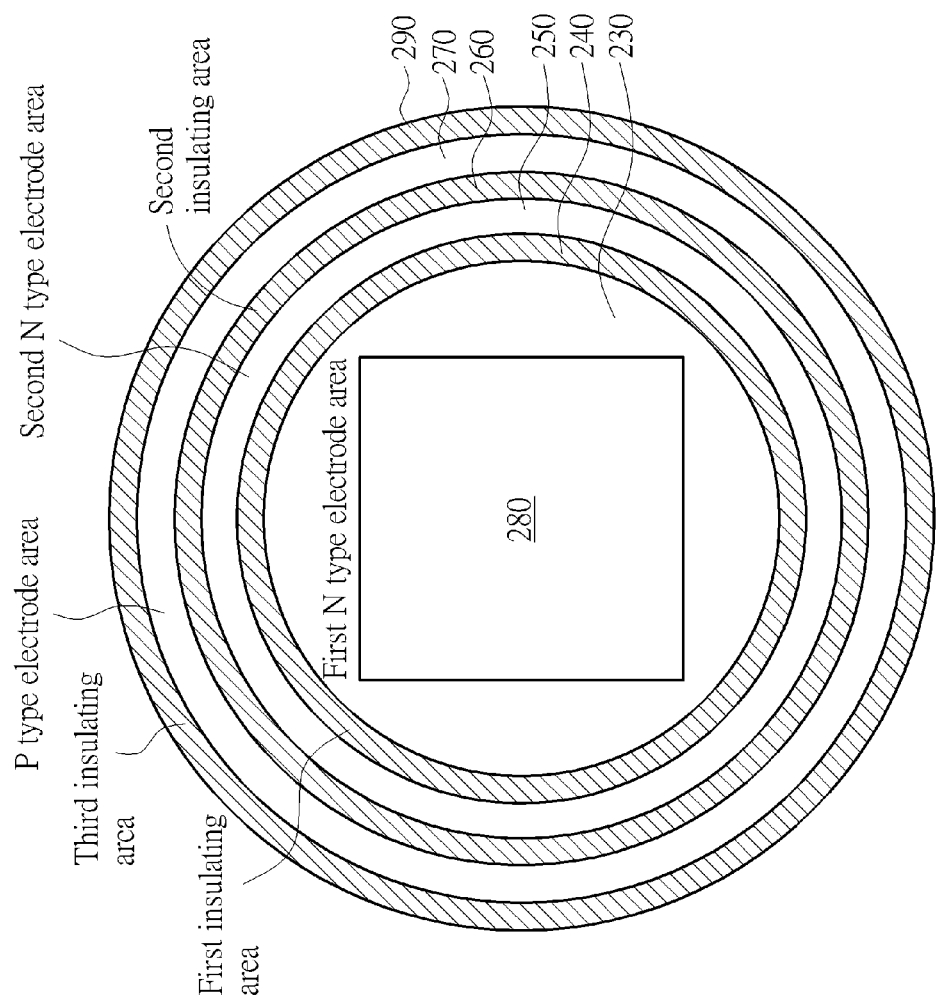
FIG. 3 is a diagram showing a second embodiment of the semiconductor structure for electrostatic discharge protection of the present invention.
Figure 4:
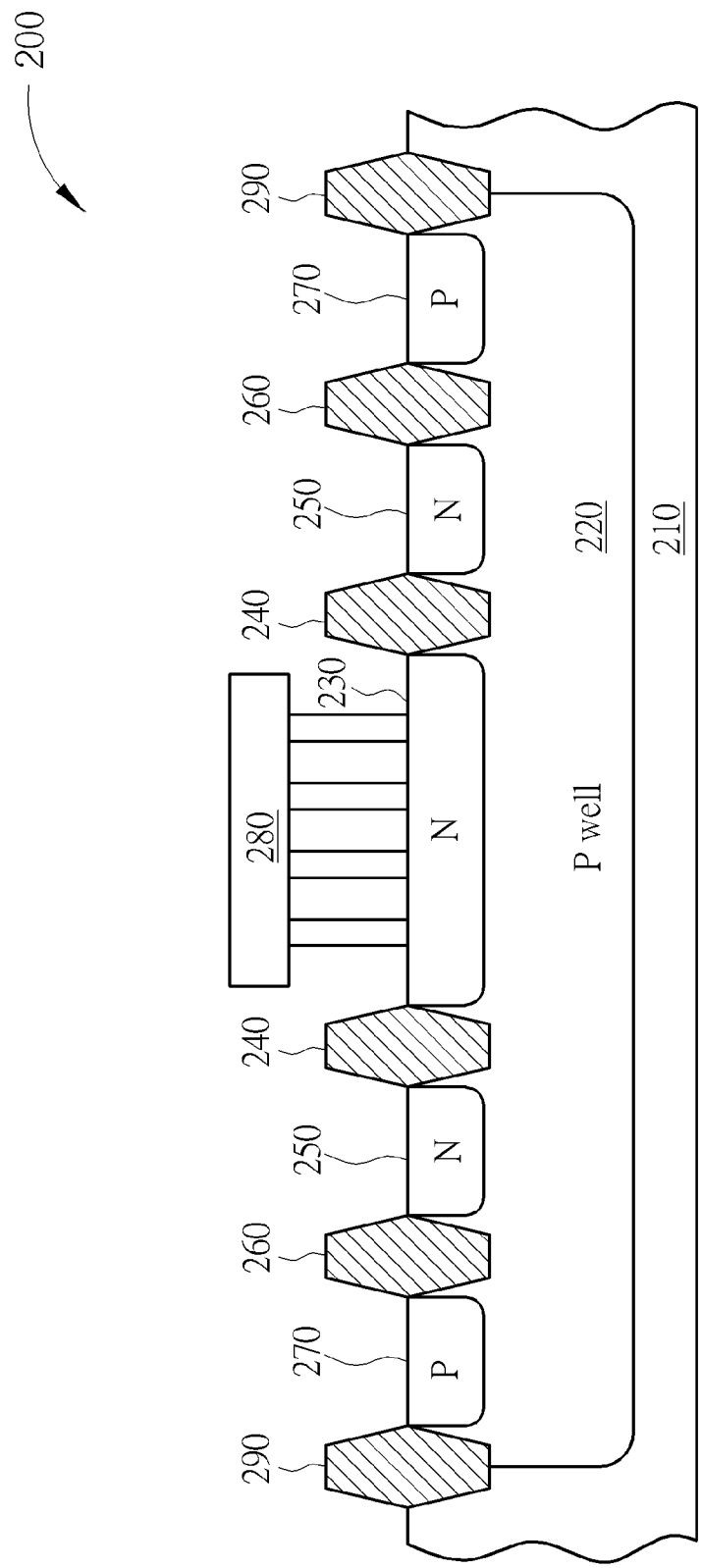
FIG. 4 is a diagram showing a cross-sectional view of the semiconductor structure for electrostatic discharge protection in FIG. 3.

Please refer to FIG. 3 and FIG. 4 together. FIG. 3 is a diagram showing a second embodiment of the semiconductor structure for electrostatic discharge protection of the present invention. FIG. 4 is a diagram showing a cross-sectional view of the semiconductor structure for electrostatic discharge protection in FIG. 3. As shown in figures, the semiconductor structure 200 for electrostatic discharge protection of the present invention comprises a P well 220, a first N type electrode area 230, a first insulating area 240, a second N type electrode area 250, a second insulating area 260, and a P type electrode area 270. The P well 220 is formed on a P type substrate 210. The first N type electrode area 230 is formed on a central region of the P well 220. The first insulating area 240 is formed on the P well 220, and surrounds the first N type electrode area 230. The second N type electrode area 250 is formed on the P well 220, and surrounds the first insulating area 240. The second insulating area 260 is formed on the P well 220, and surrounds the second N type electrode area 250. The P type electrode area 270 is formed on the P well 220, and surrounds the second insulating area 260. The semiconductor structure 200 for electrostatic discharge protection of the present invention can further comprise an N well, such that the first N type electrode area 230 is partially formed on the N well. Different from the first embodiment, periphery outlines of the first N type electrode area 230 and the second N type electrode area 250 of the semiconductor structure 200 are circles and concentric.

Similarly, according to the above arrangement, the P well 220, the first N type electrode area 230, the second N type electrode area 250, and the P type electrode area 270 can be equivalent to a bipolar junction transistor. When an electrostatic discharge protection electrode 280 receives static electricity, a PN junction between the P well 220 and the first N type electrode area 230 is broken down due to a high level voltage of the static electricity, so as to discharge current to the second N type electrode area 250 and the P type electrode area 270, in order to provide electrostatic discharge protection. Moreover, partial energy of the static electricity is absorbed when the PN junction is broken down.

Likewise, in order to further improve the ability resistant to high voltage, the first N type electrode area 230 can be also extended outward to form an N type doping area (not shown in figures). Doping concentration of the N type doping area is lower than doping concentration of the first N type electrode area 230.

On the other hand, since the periphery outlines of the first N type electrode area 230 and the second N type electrode area 250 are circles, there is no point discharge between the first N type electrode area 230 and the second N type electrode area 250. That is, the current discharge capability from the first N type electrode area 230 to the second N type electrode area 250 can be further improved without arranging a non-conductive area on the second N type electrode area 250.

Figure 5:
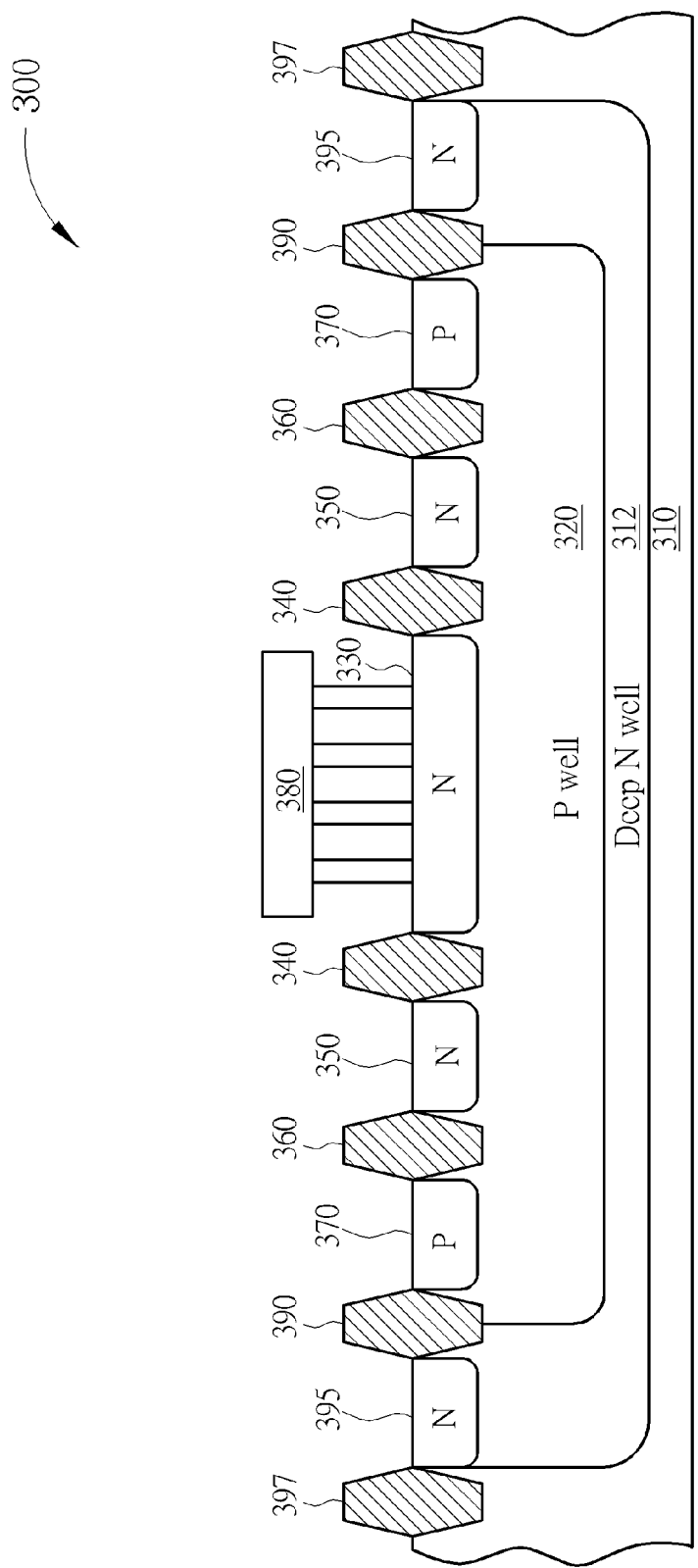
FIG. 5 is a diagram showing a cross-sectional view of a third embodiment of the semiconductor structure for electrostatic discharge protection of the present invention.

Please refer to FIG. 5. FIG. 5 is a diagram showing a cross-sectional view of a third embodiment of the semiconductor structure for electrostatic discharge protection of the present invention. As shown in FIG. 5, the semiconductor structure 300 for electrostatic discharge protection of the present invention can further comprise a deep N well 312 (or N type buried layer) formed between a P well 320 and a P type substrate 310 for insulating the P well 320 from the P type substrate 310. In addition, the semiconductor structure 300 for electrostatic discharge protection of the present invention can further comprise a third N type electrode area 395 and a fourth insulating area 397. The third N type electrode area 395 is formed on the deep N well 312, and surrounds a P type electrode area 370. The fourth insulating area 397 surrounds the third N type electrode area 395. Periphery outlines of the N type electrode areas and P type electrode area 370 of the semiconductor structure 300 for electrostatic discharge protection of the present invention can be 8K sided polygons or circles.

Figure 6:
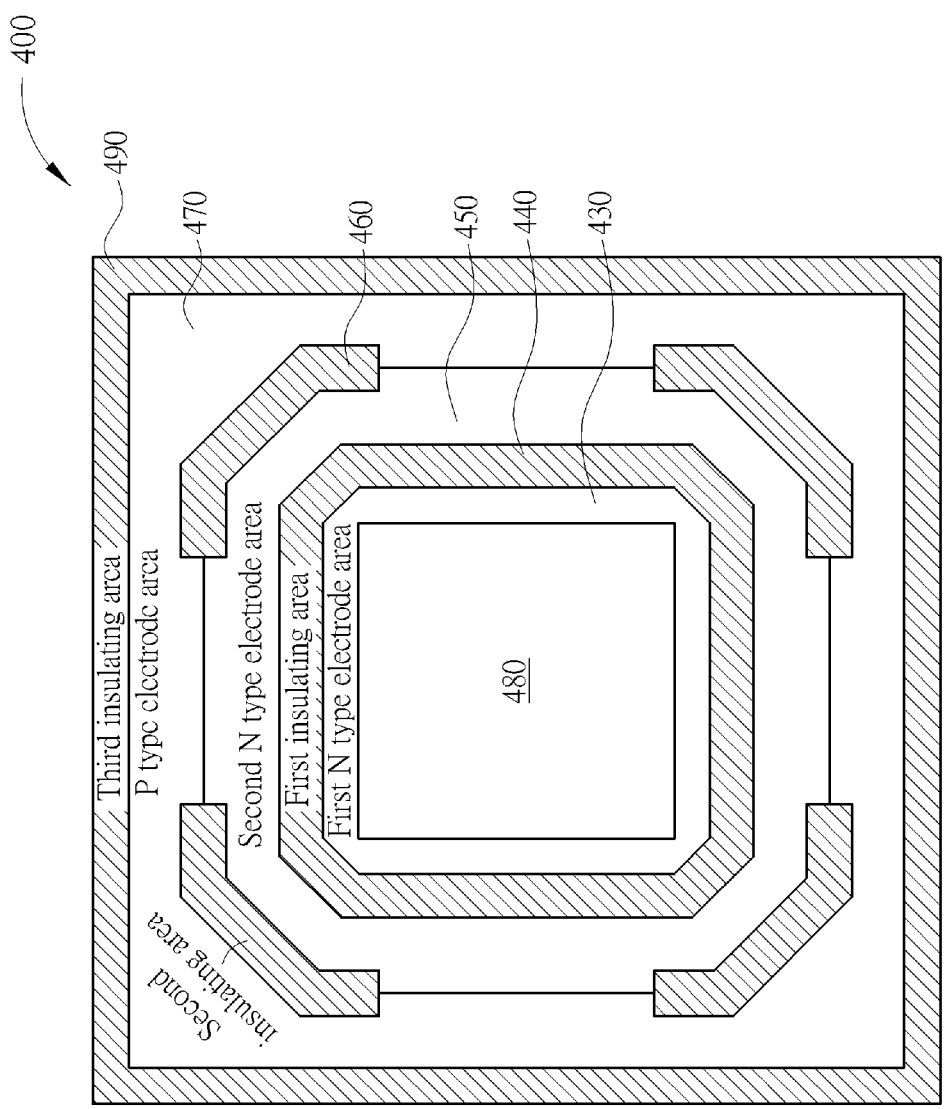
FIG. 6 is a diagram showing a fourth embodiment of the semiconductor structure for electrostatic discharge protection of the present invention.
Figure 7:
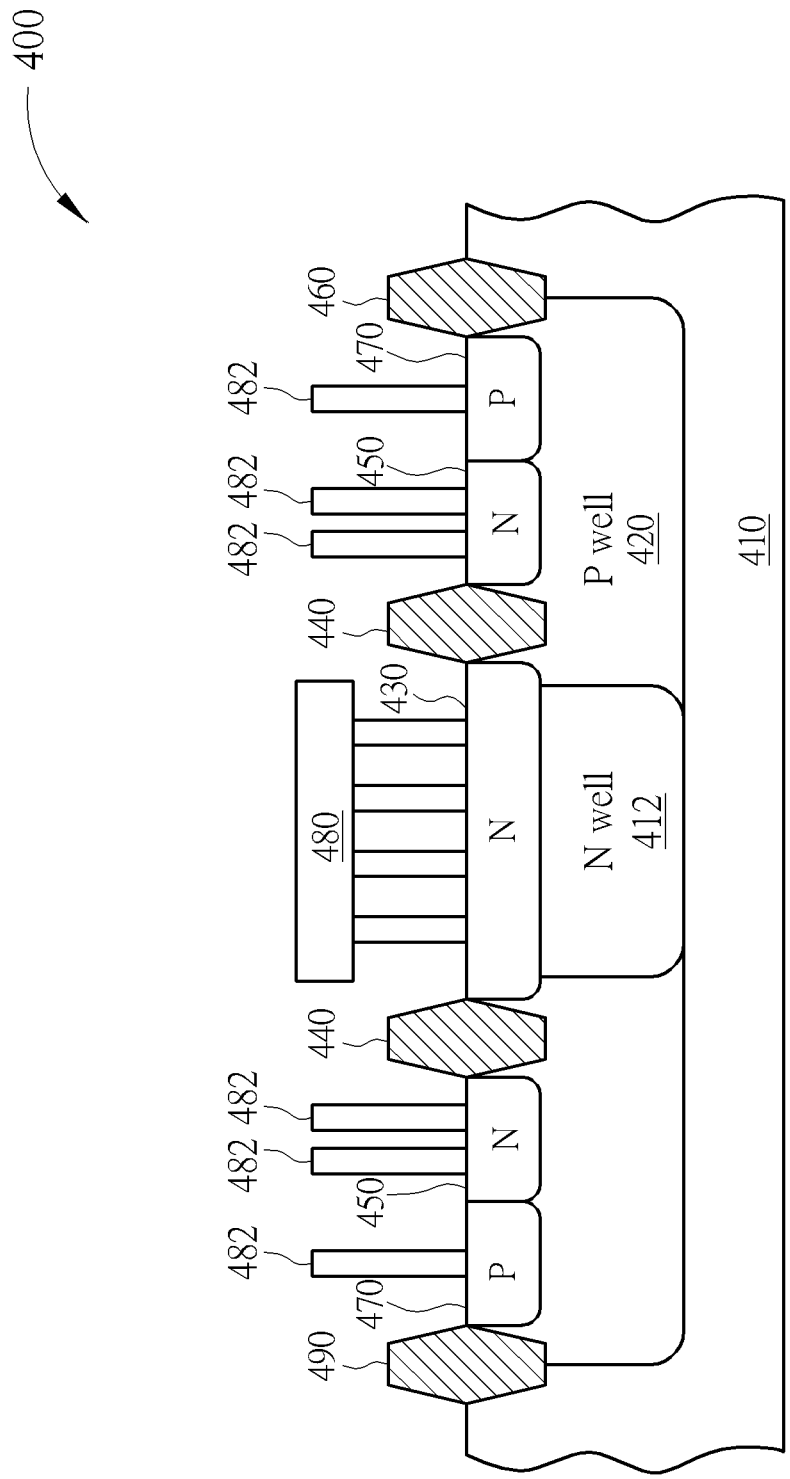
FIG. 7 is a diagram showing a cross-sectional view of the semiconductor structure for electrostatic discharge protection in FIG. 6.

Please refer to FIG. 6 and FIG. 7 together. FIG. 6 is a diagram showing a fourth embodiment of the semiconductor structure for electrostatic discharge protection of the present invention. FIG. 7 is a diagram showing a cross-sectional view of the semiconductor structure for electrostatic discharge protection in FIG. 6. As shown in figures, the semiconductor structure 400 for electrostatic discharge protection of the present invention comprises a P well 420, an N well 412, a first N type electrode area 430, a first insulating area 440, a second N type electrode area 450, a P type electrode area 470, and a second insulating area 460. The P well 420 is formed on a P type substrate 410. The N well 412 is formed on a central region of the P well 420. The first N type electrode area 430 is partially formed on the P well 420 and the N well 412. The first insulating area 440 is formed on the P well 420, and surrounds the first N type electrode area 430. The second N type electrode area 450 is formed on the P well 420, and surrounds the first insulating area 440. The P type electrode area 470 is formed on the P well 420, and surrounds the second N type electrode area 450. The second insulating area 460 is formed on the P well 420, and surrounds the P type electrode area 470. The second insulating area 460 partially surrounds the second N type electrode area 450, and the P type electrode area 470 and the second N type electrode area 450 are partially coupled at areas where the second insulating area 460 does not surround the second N type electrode area 450. The P type electrode area 470 and the second N type electrode area 450 have a same voltage level. Arrangement of connecting the two electrode areas 450, 470 can reduce overall area of structure. Wherein periphery outlines of the first N type electrode area 430 and the second N type electrode area 450 can be 8K sided polygons or circles, and K is a positive integer In addition, the first N type electrode area 430 is electrically connected to an electrostatic discharge protection electrode 480. The P type electrode area 470 is electrically connected to ground. Coupling structures 482 can be formed on the second N type electrode area 450 and the P type electrode area 470 for electrically connecting to other elements. Moreover, the semiconductor structure 400 for electrostatic discharge protection of the present invention can further comprise a third insulting area 490, which is formed on a periphery of the P well 420, and surrounds the P type electrode area 470.

According to the above arrangement, when the electrostatic discharge protection electrode 480 receives static electricity, a PN junction between the P well 420 and the first N type electrode area 430 is broken down due to a high level voltage of the static electricity, so as to discharge current to the P type electrode area 470, in order to provide electrostatic discharge protection. Moreover, partial energy of the static electricity is absorbed when the PN junction is broken down.

Similarly, in order to further improve the ability resistant to high voltage, the first N type electrode area 430 can be also extended outward to form an N type doping area (not shown in figures). Doping concentration of the N type doping area is lower than doping concentration of the first N type electrode area 430.

In other embodiments of the present invention, the N well 412 in FIG. 7 is not necessarily required.

Figure 8:
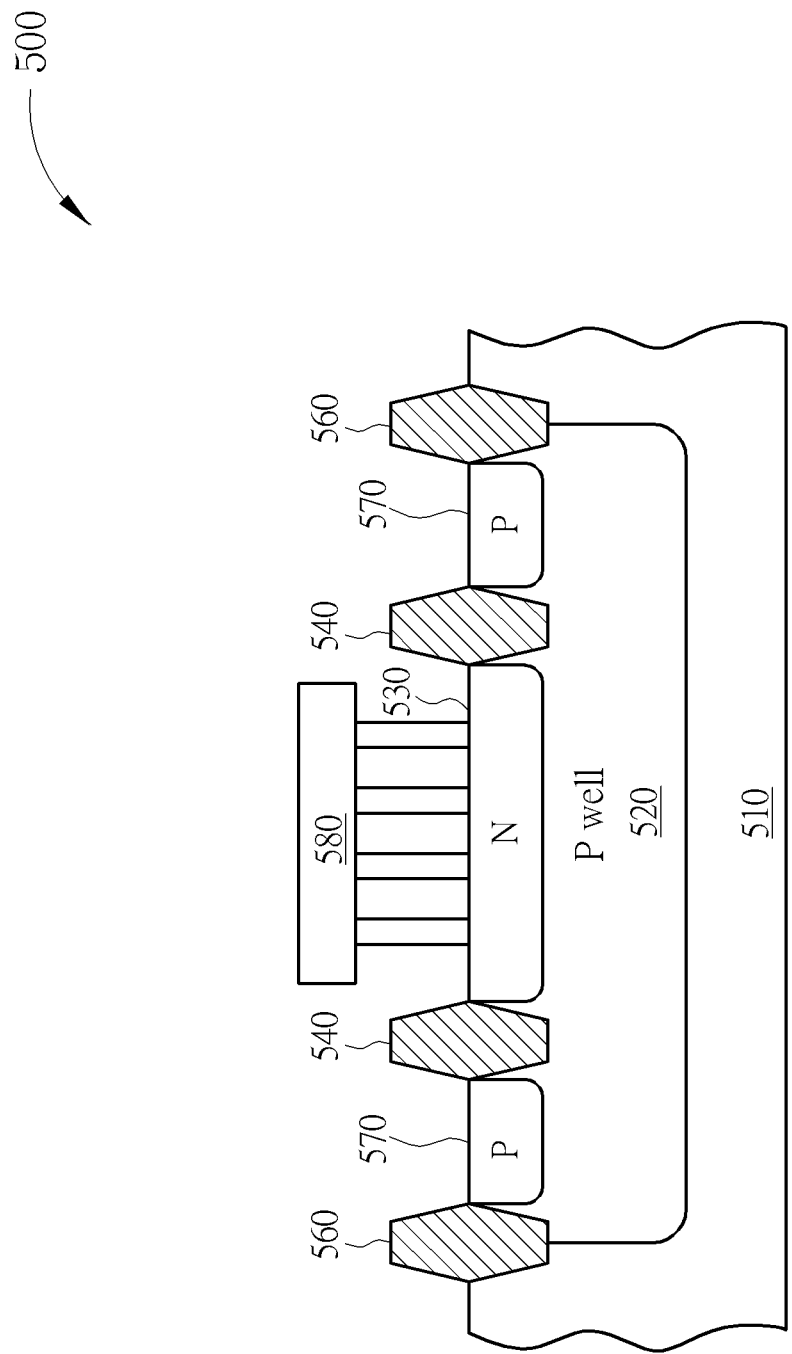
FIG. 8 is a diagram showing a cross-sectional view of a fifth embodiment of the semiconductor structure for electrostatic discharge protection of the present invention.

Please refer to FIG. 8. FIG. 8 is a diagram showing a cross-sectional view of a fifth embodiment of the semiconductor structure for electrostatic discharge protection of the present invention. As shown in FIG. 8, the semiconductor structure 500 for electrostatic discharge protection of the present invention comprises a P well 520, a first N type electrode area 530, a first insulating area 540, a P type electrode area 570, and a second insulating area 560. The P well 520 is formed on a P type substrate 510. The first N type electrode area 530 is formed on a central region of the P well 520. The first insulating area 540 is formed on the P well 520, and surrounds the first N type electrode area 530. The P type electrode area 570 is formed on the P well 520, and surrounds the first insulating area 540. Wherein, a periphery outline of the first N type electrode area 530 is an $8k$ sided polygon or circle. The semiconductor structure 500 for electrostatic discharge protection of the present invention can further comprise an N well, such that the first N type electrode area 530 is partially formed on the N well.

In addition, the first N type electrode area 530 is electrically connected to an electrostatic discharge protection electrode 580. The P type electrode area 570 is electrically connected to ground.

According to the above arrangement, the P well 520, the first N type electrode area 530, and the P type electrode area 570 can be equivalent to a diode. When the electrostatic discharge protection electrode 580 receives static electricity, a PN junction between the P well 520 and the first N type electrode area 530 is broken down due to a high level voltage of the static electricity, so as to discharge current to the P type electrode area 570, in order to provide electrostatic discharge protection. Moreover, partial energy of the static electricity is absorbed when the PN junction is broken down.

Similarly, in order to further improve the ability resistant to high voltage, the first N type electrode area 530 can be also extended outward to form an N type doping area (not shown in figures). Doping concentration of the N type doping area is lower than doping concentration of the first N type electrode area 530.

In the present invention, the above semiconductor structure for electrostatic discharge protection can be arranged in an integrated circuit for preventing the integrated circuit from being damaged by static electricity. Since the periphery outlines of the first N type electrode area and the second N type electrode area can be 8K sided polygons or circles, a range of point discharge of the first N type electrode area can be reduced, so as to increase ranges of current discharge areas between the first N type electrode area and the second N type electrode area, and relatively reduce the total area of the semiconductor structure. Therefore, the semiconductor structure for electrostatic discharge protection of the present invention occupies a smaller area in the integrated circuit.

In contrast to the prior art, the second N type electrode area of the semiconductor structure for electrostatic discharge protection of the present invention has a smaller non-conductive area or even has no non-conductive area, so as to improve current discharge capability between electrode areas, and further improve electrostatic protection capability of the semiconductor structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor structure for electrostatic discharge protection, comprising: a P well formed on a P type substrate; a first N type electrode area formed on a central region of the P well; a first insulating area formed on the P well and surrounding the first N type electrode area; a second N type electrode area formed on the P well and surrounding the first insulating area; a second insulating area formed on the P well and surrounding the second N type electrode area; and a P type electrode area formed on the P well and surrounding the second insulating area, the P type electrode area having a first part directly connected to the second N type electrode area and a second part separated from the second N type electrode area by the second insulating area, the P type electrode area and the second N type electrode area having a same voltage level; wherein periphery outlines of the first N type electrode area and the second N type electrode area are 8K sided polygons or circles, and K is equal to 1.

2. The semiconductor structure of claim 1, wherein the periphery outlines of the first N type electrode area and the second N type electrode area are both 8K sided polygons or circles and concentric.

3. The semiconductor structure of claim 1, wherein the first insulating area 30 and the second insulating area are field oxide (FOX) areas.

4. The semiconductor structure of claim 1, wherein the first N type electrode area is electrically connected to an electrostatic discharge protection electrode.

5. The semiconductor structure of claim 1 further comprising a deep N well or an N type buried layer formed between the P well and the P type substrate.

6. The semiconductor structure of claim 1, wherein the P type electrode area is electrically connected to ground.

7. The semiconductor structure of claim 1, wherein when the periphery outlines of the first N type electrode area and the second N type electrode area are both 8K sided polygons, corners of the second N type electrode area are non-conductive.

8. The semiconductor structure of claim 1 further comprising a third insulating area formed on a periphery of the P well and surrounding the P type electrode area.

9. The semiconductor structure of claim 1 being arranged in an integrated circuit.

10. The semiconductor structure of claim 1 further comprising an N well formed on the central region of the P well, wherein the first N type electrode area is partially formed on the N well.

11. The semiconductor structure of claim 1, wherein the first N type electrode area is extended outward to form an N type doping area, and doping concentration of the N type doping area is lower than doping concentration of the first N type electrode area.

* * * * *